United States Patent
Huang et al.

(10) Patent No.: US 10,242,752 B2
(45) Date of Patent: Mar. 26, 2019

(54) METHOD FOR SCREENING BAD COLUMN AND DATA STORAGE DEVICE WITH BAD COLUMN SUMMARY TABLE

(71) Applicant: Silicon Motion, Inc., Jhubei, Hsinchu (TW)

(72) Inventors: Sheng-Yuan Huang, New Taipei (TW); Wen-Wu Tseng, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/216,702

(22) Filed: Jul. 22, 2016

(65) Prior Publication Data
US 2017/0323688 A1    Nov. 9, 2017

(30) Foreign Application Priority Data
May 5, 2016    (TW) .............................. 105113945 A

(51) Int. Cl.
| | | |
|---|---|---|
| G11C 29/00 | (2006.01) | |
| G11C 29/38 | (2006.01) | |
| G11C 29/44 | (2006.01) | |
| G11C 29/36 | (2006.01) | |

(52) U.S. Cl.
CPC .............. *G11C 29/38* (2013.01); *G11C 29/44* (2013.01); *G11C 29/36* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 6,687,860 B1* | 2/2004 | Iijima | G06F 12/0207 365/201 |
| 6,748,562 B1 | 6/2004 | Krech, Jr. et al. | |
| 9,786,388 B1* | 10/2017 | Nassie | G11C 29/56008 |
| 2007/0079182 A1* | 4/2007 | Chen | G11B 20/1833 714/704 |
| 2009/0172266 A1* | 7/2009 | Kimura | G06F 12/1408 711/103 |
| 2010/0185912 A1* | 7/2010 | Chung | G11B 7/0065 714/752 |
| 2014/0082264 A1* | 3/2014 | Wan | G06F 11/1012 711/103 |
| 2014/0157087 A1* | 6/2014 | Yurzola | G06F 11/1068 714/773 |

(Continued)

FOREIGN PATENT DOCUMENTS

TW    I353607    12/2011

*Primary Examiner* — Daniel F. McMahon

(57) ABSTRACT

A method for screening bad columns applicable to a data storage medium is disclosed. The method for screening bad columns includes steps of: reading out written data of at least one of the data pages of at least one of the data blocks; comparing the written data with predetermined data to obtain a number of error bits in each of the columns in each of the segments in the at least one of the data pages, and accordingly calculating a total number of error bits in each of the segments; determining a segment having a largest total number of error bits from the segments, and determining and recording a column having a largest number of error bits from the segment having the largest total number of error bits as a bad column. A data storage device saving a bad column summary table is also disclosed.

2 Claims, 6 Drawing Sheets

(56) References Cited

U.S. PATENT DOCUMENTS

| | | |
|---|---|---|
| 2014/0181621 A1 | 6/2014 | Lin et al. |
| 2015/0179279 A1 | 6/2015 | Yen et al. |
| 2015/0370632 A1 | 12/2015 | Yurzola et al. |
| 2016/0147448 A1* | 5/2016 | Schreter ............... G06F 3/0604 711/159 |
| 2017/0262218 A1* | 9/2017 | Chiang ................ G06F 3/0611 |

* cited by examiner

METHOD FOR SCREENING BAD COLUMN AND DATA STORAGE DEVICE WITH BAD COLUMN SUMMARY TABLE

FIELD OF THE INVENTION

The present invention relates to a data storing technology, and more particularly to a method for screening bad columns and a data storage device with a bad column summary table.

BACKGROUND OF THE INVENTION

Data storage device, such as solid state drive (SSD), secure digital (SD) memory card or portable flash memory, mainly is constituted by a control unit and a data storage medium. And the data storage medium is constituted by a plurality of columns for storing data.

Inevitably, secondary products may be produced in the manufacturing process of data storage devices. Therefore, it is necessary to screen all the bad columns in the data storage medium and record the bad columns in a bad column summary table before shipping the secondary products to market. According to the bad column summary table, the control unit is prevented from accessing these bad columns so as to avoid data access error during operation.

In general, data storage device uses error correcting code (ECC) to correct its stored data. However, the conventional method for screening bad columns may not only waste a lot of usable storage space but also result in data storage or correction problems due to the low effectiveness of reducing the number of bad columns.

SUMMARY OF THE INVENTION

One objective of the present invention is to provide a method of screening bad column applicable to a data storage device. Through the method, the storage space which is mistakenly defined as bad storage space in prior art is still usable and consequentially the data storage device has increasing storage space.

Another objective of the present invention is to provide a data storage device with a bad column summary table, wherein the data storage device is able to adopt the aforementioned method of screening bad column.

The present invention provides a method for screening bad columns applicable to a data storage medium. The data storage medium includes a plurality of data blocks. Each of the data blocks includes a plurality of columns divided into a plurality of segments. Each of the data blocks further includes a plurality of data pages. Each of the data pages includes the columns arranged in a same row. The method for screening bad column includes steps of: reading out written data of at least one of the data pages of at least one of the data blocks; comparing the written data with predetermined data to obtain a number of error bits in each of the columns in each of the segments in the at least one of the data pages, and accordingly calculating a total number of error bits in each of the segments; determining a segment having a largest total number of error bits from the segments; and determining and recording a column having a largest number of error bits from the segment having the largest total number of error bits as a bad column.

The present invention further provides a data storage device for storing a bad column summary table. The data storage device includes a control unit and a data storage medium. The data storage medium includes a plurality of data blocks. Each of the data blocks includes a plurality of columns divided into a plurality of segments. Each of the data blocks further includes a plurality of data pages. Each of the data pages includes the columns arranged in a same row. The bad column summary table is generated and updated according to steps of: reading out written data of at least one of the data pages of at least one the data blocks; comparing the written data with predetermined data to obtain a number of error bits in each of the columns in each of the segments in the at least one of the data pages, and accordingly calculating a total number of error bits in each of the segments; determining a segment having a largest total number of error bits from the segments; and determining and recording a column having a largest number of error bits from the segment having the largest total number of error bits as a bad column.

In summary, the method for screening bad column of the present invention first determines the segment having the largest total number of error bits in a certain number of data blocks, determines the column having the largest number of error bits in the segment having the largest total number of error bits as a bad column, and records the bad column in the bad column summary table. Therefore, the control unit of the data storage device of the present invention can be prevented from accessing these bad columns according to the bad column summary table. As a result, all the segments can be used for storing data except the bad columns, and consequentially the data storage medium of the data storage device of the present invention has the optimizing data storage capacity.

BRIEF DESCRIPTION OF THE DRAWINGS

Other advantages, objectives and features of the present invention will become apparent from the following description referring to the attached drawings.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 6:
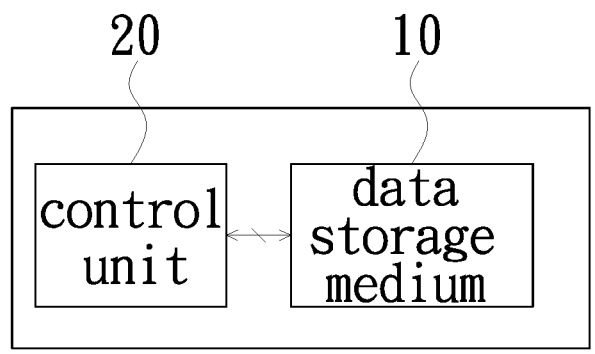
FIG. 6 is a schematic block view of a data storage device in accordance with an embodiment of the present invention.

FIG. 6 is a schematic block view of a data storage device in accordance with an embodiment of the present invention. As shown, the data storage device of the present embodiment includes a data storage medium 10 and a control unit 20. The control unit 20 is electrically coupled to the data storage medium 10 and configured to perform data access on the data storage medium 10.

Figure 1:
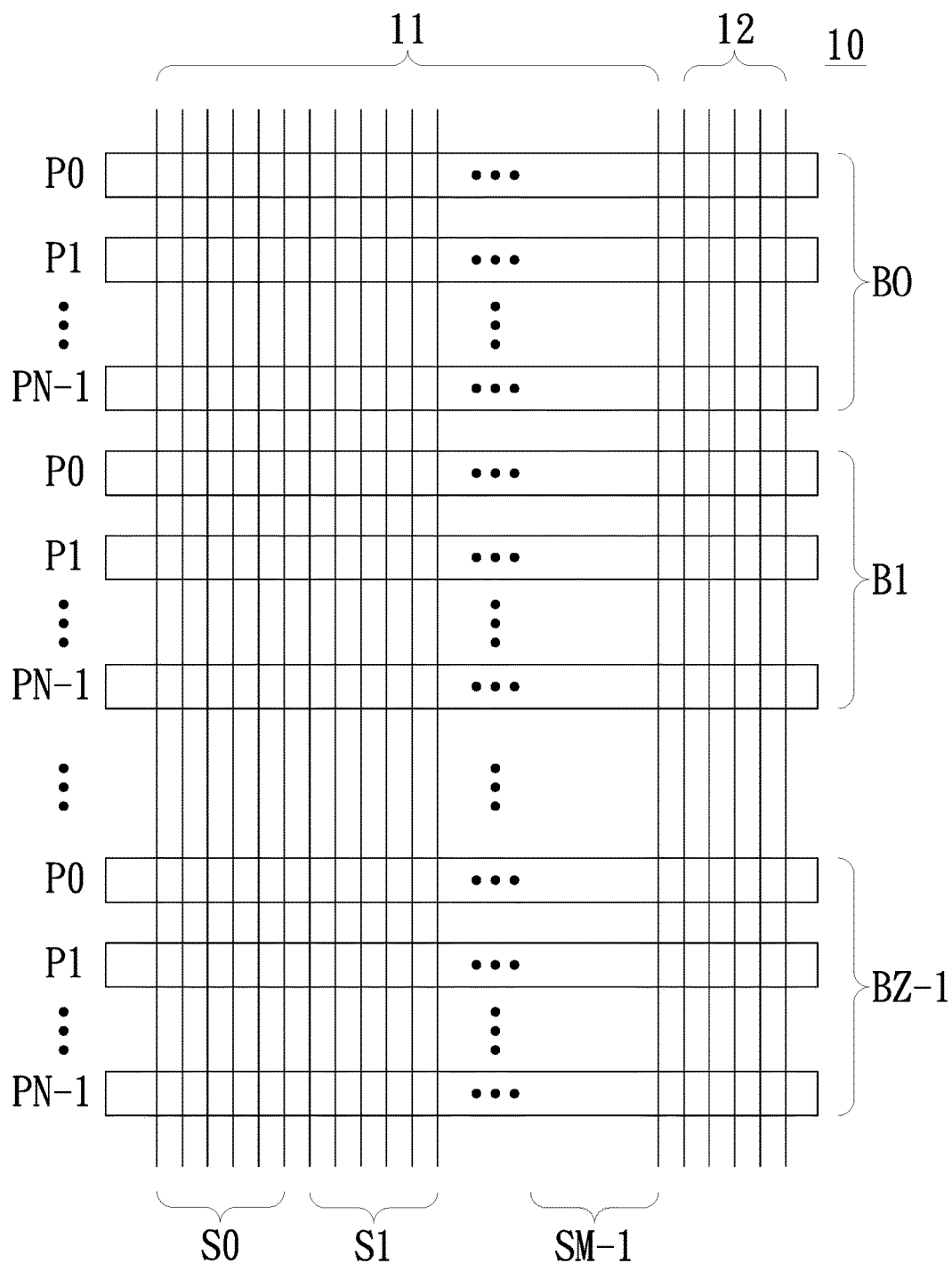
FIG. 1 is a schematic view of a data storage medium.

FIG. 1 is a schematic view of a data storage medium. As shown, the data storage medium 10 includes Z data blocks, which are data blocks B0, B1, . . . , and BZ-1. In response to facilitate data logic management, the data storage medium 10 is divided into a data area 11 and a spare area 12. Both of the data area 11 and the spare area 12 include a plurality of columns respectively for storing data and spare data (e.g., metadata) individually. In one preferred embodiment, each column can store 8-bit data. Further, the columns arranged in the same row constitute a data page. Each data block includes N data pages, which are data pages P0, P1, . . . , and PN-1. Each data page includes some columns in the data area 11 and some columns in the spare area 12. According to the user's needs, the columns in the data area 11 can be divided into M segments, which are segments S0, S1, . . . , and SM-1. Each segment includes Y columns. In the present embodiment, the total number of the columns in the data area 11 is divisible by M; and the aforementioned Z, N, M, and Y are positive integers. In the present embodiment, the data storage medium 10 may be a non-volatile memory such as a flash memory, MRAM (Magnetic RAM), FRAM (Ferroelectric RAM), PCM (Phase Change Memory), STTRAM (Spin-Transfer Torque RAM), ReRAM (Resistive RAM) or Memristor capable of storing data for a long time.

A method for screening bad columns disclosed in the present invention will be described as follow. In order to improve the efficiency of screening bad columns, preferably, a portion of the data blocks in the data storage medium 10 are selected randomly as sample blocks for executing the method for screening bad columns of the present invention; however, the present invention is not limited thereto. Hereunder the description of the present invention is based on selecting data blocks B0 and B1 as the sample blocks.

Figure 2:
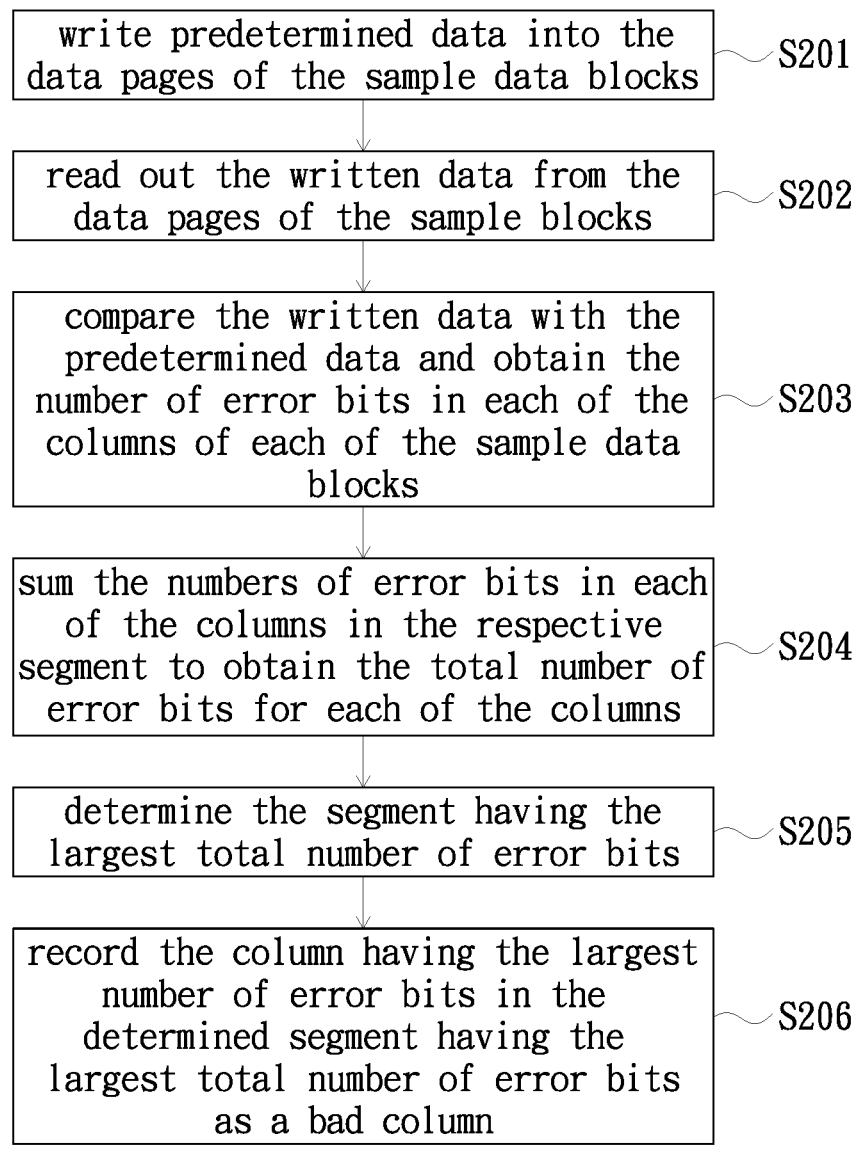
FIG. 2 is a flowchart of a method for screening bad column in a data storage medium in accordance with an embodiment of the present invention.

FIG. 2 is a flowchart of a method for screening bad columns in a data storage medium in accordance with an embodiment of the present invention. Please refer to FIGS. 1 and 2 together. First, predetermined data is written into the data pages of the sample blocks (step S201). In the present embodiment, for example, the predetermined data is written into the data pages P0 to PN-1 of each one of the sample blocks B0 and B1. In one embodiment, the predetermined data may be specific or random data. Then, read out the written data from the data pages of the sample blocks (step S202). In the present embodiment, for example, the written data is obtained by reading the data stored in the data pages P0 to PN-1 of each one of the sample blocks B0 and B1. Then, the written data is compared with the predetermined data in bit as a unit to obtain a number of error bits in each column of each one of the sample data blocks B0 and B1 (step S203). In the present embodiment, specifically, if one specified bit in the written data is not equal to the respective bit in the predetermined data, this bit is determined as an error bit, and the aforementioned number of error bits is obtained by summing the numbers of error bits occurring in one column. In the embodiment each column can store 8-bit data. A number of error bits of 1 is obtained if there is one bit of data error occurring in the respective column; a number of error bits of 8 is obtained if all bits of 8-bit data are error occurring in the respective column; a number of error bits of 10 is obtained if the same bit in different ten pages are error in the respective column, and so on.

Figure 3:
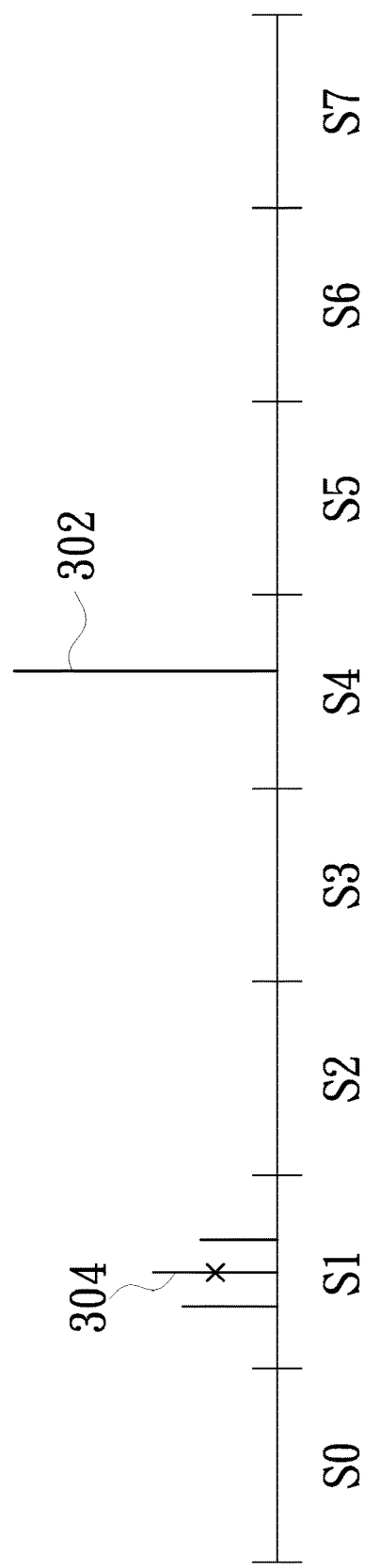
FIG. 3 is an exemplary diagram for illustrating the process of obtaining the total number of error bits for eight segments.

Based on M=8, FIG. 3 is an exemplary diagram for illustrating the process of obtaining the total number of error bits for the eight segments. In FIG. 3, the horizontal axis represents the eight segments S0-S7; each vertical line represents the position of the respective column; the length of each vertical line represents the total number of error bits in the respective column; the length of each vertical line is proportional to the respective total number of bit errors; and the total number of error bits in a column could be omitted if lower than a threshold. As illustrated in FIG. 3, the segment S1 has three vertical lines, among which the vertical line 304 has the most length. The segment S4 has one vertical line, and the length of the vertical line 302 is greater than the length of the vertical line 304 in the segment S1.

Please refer to FIGS. 2 and 3. Once the step S203 is completed, the total number of error bits in each segment is obtained by summing the numbers of error bits in each column in the respective segment (step S204). Then, the segment having the largest total number of error bits is determined (step S205). Herein it is assumed that the total number of error bits corresponding to the vertical line 302 of the segment S4 is 60; and the total numbers of error bits corresponding to the three vertical lines of the segment S1 from left to right are 25, 30 and 20 individually. Therefore, although the vertical line 302 has a number of error bits greater than the vertical line 304 has, the segment S1 is determined as the segment having the largest total number of error bits due to that the sum of the numbers of error bits thereof is 75 (25+30+20=75) which is greater than the sum of the numbers of error bits in the segment S4. Once the step S205 is completed, determine and record the column having the largest number of error bits in the segment having the largest total number of error bits as a bad column (step S206). In the present embodiment, for example, the column corresponding to the vertical line 304 is recorded as a bad column due to that the vertical line 304 has the largest number of error bits (e.g., 30) in the segment S1 having the largest total number of error bits (e.g., 75). Further, the determined bad column is then recorded in a bad column summary table which may be stored in the data storage device. As illustrated in FIG. 3, the vertical line is then marked with "x" which indicates that the column corresponding to the vertical line 304 is recorded as a bad column. Through repeating the aforementioned steps, it is understood that the column corresponding to the vertical line 302 will be the next one to be determined and recorded as a bad column, and so on.

Figure 4:
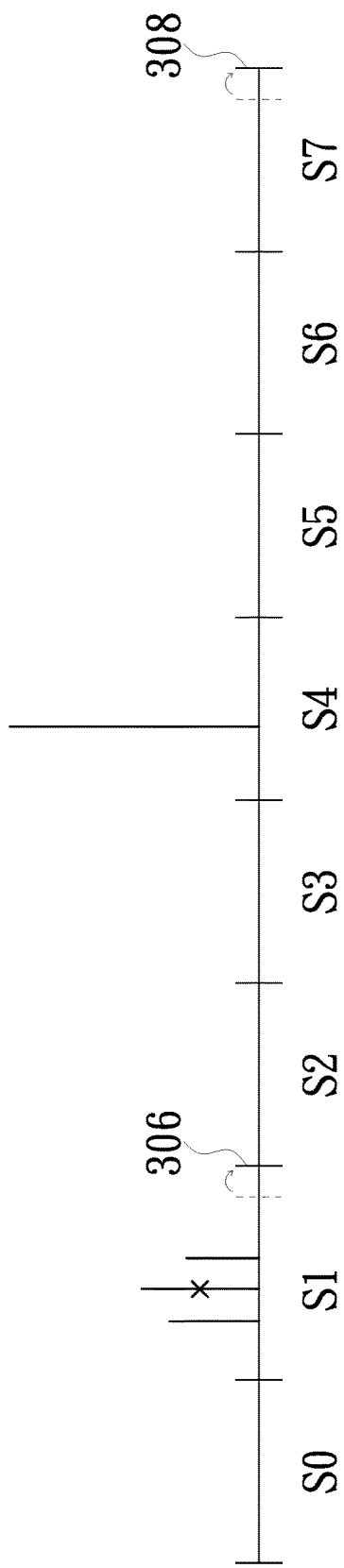
FIG. 4 is a diagram for illustrating the re-allocation of the segments in FIG. 3.

Through reading the bad column summary table, the control unit of the data storage device can know the positions of the bad columns and accordingly stop accessing those recorded bad columns any more. When the vertical line 304 is recorded as a bad column, accordingly the number of the usable columns in the segment S1 is reduced. Therefore, to guarantee that the segment S1 can still have a normal operation, the border of the segment S1 may extend one more column (or one column shift) toward the segment S2 so as to make the total number of columns in the segment S1 is not changed (e.g., still have Y columns). It is to be noted that all the segments on the right of the segment S1 have to run a re-allocation. For example, both borders of each one of the segments S2-S7 are shifted one column rightward; consequentially, the segment S7 may include one column which is originally categorized into the spare area and accordingly the spare area has one column less. FIG. 4 is a diagram for illustrating the re-allocation of the segments in FIG. 3. As shown, because of the segment S1 has one bad column, the right border of the segment S1 is shifted rightward for one column to the column 306 which is originally belonged to the segment S2. Therefore, the total number of the usable columns in the segment S1 is unchanged. Because of the right border of the segment S1 has one column shift; consequentially each border of each one of the segments S2-S7 has shifted rightward for one column as well, and the right border of the segment S7 includes the column 308 which is originally belonged to the spare area. It is to be noted that once the aforementioned steps are repeated four times, the three columns having error bits in the segment S1 as well as the column having error bits in the segment S4 are all determined as bad columns and recorded in the bad column summary table; therefore, the number of error bits of the segments after reallocation are getting smaller and closer.

The correction capability of error correcting code (ECC) is inversely proportional to the number of bit errors contained in the segment. As illustrated in FIG. 3, for example, the number of error bits in each column in the segment S1 is less than the number of error bits in the column 302 in the segment S4. However, the total number of error bits in the segment S1 is greater than that in the segment S4 and may exceed the correction capability of error correcting code (ECC); therefore, compared with the segment S4, the segment S1 has more urgency to move the bad columns therein.

The aforementioned method for determining and recording the bad columns can performed repeatedly until the bad column summary table is full and cannot record a bad column any more (e.g., the bad column summary table may record up to 256 pieces of bad column data in one embodiment) or until all the total numbers of error bits in the segments are lower than a threshold (e.g., the threshold is preferable 10 in one embodiment). By using the method for screening bad column of the present invention, the number of error bits required to be removed is effectively reduced, and it also prevents a whole data page from being deemed as a damaged data page by reducing the total number of error bits to be within the correction capability of error correcting code (e.g., the ECC may correct up to 44 error bits in one embodiment). In summary, although it may reduce the number of columns in the spare area, the method for screening bad column of the present invention can reuse a segment which is determined as a bad segment in prior art and consequentially make the data storage device of the present invention have increasing usable data storage capacity as well as guarantee all the data stored therein is accessed and corrected effectively.

In one embodiment, the aforementioned total number of error bits can be replaced by a total number of average error bits. This replacement is an alternative mathematics choice and the purpose of the present invention is still achieved without colorful modification; thus, no redundant detail is to be given herein.

To accelerate the implementation of the method for determining and recording the bad column of the present invention, only a portion of data pages in one data block is involved for the calculation of the error in one embodiment, instead of involving all data pages in one data block. With the calculation modification, the purpose of the present invention is still achieved without any change; thus, no redundant detail is to be given herein.

Figure 5:
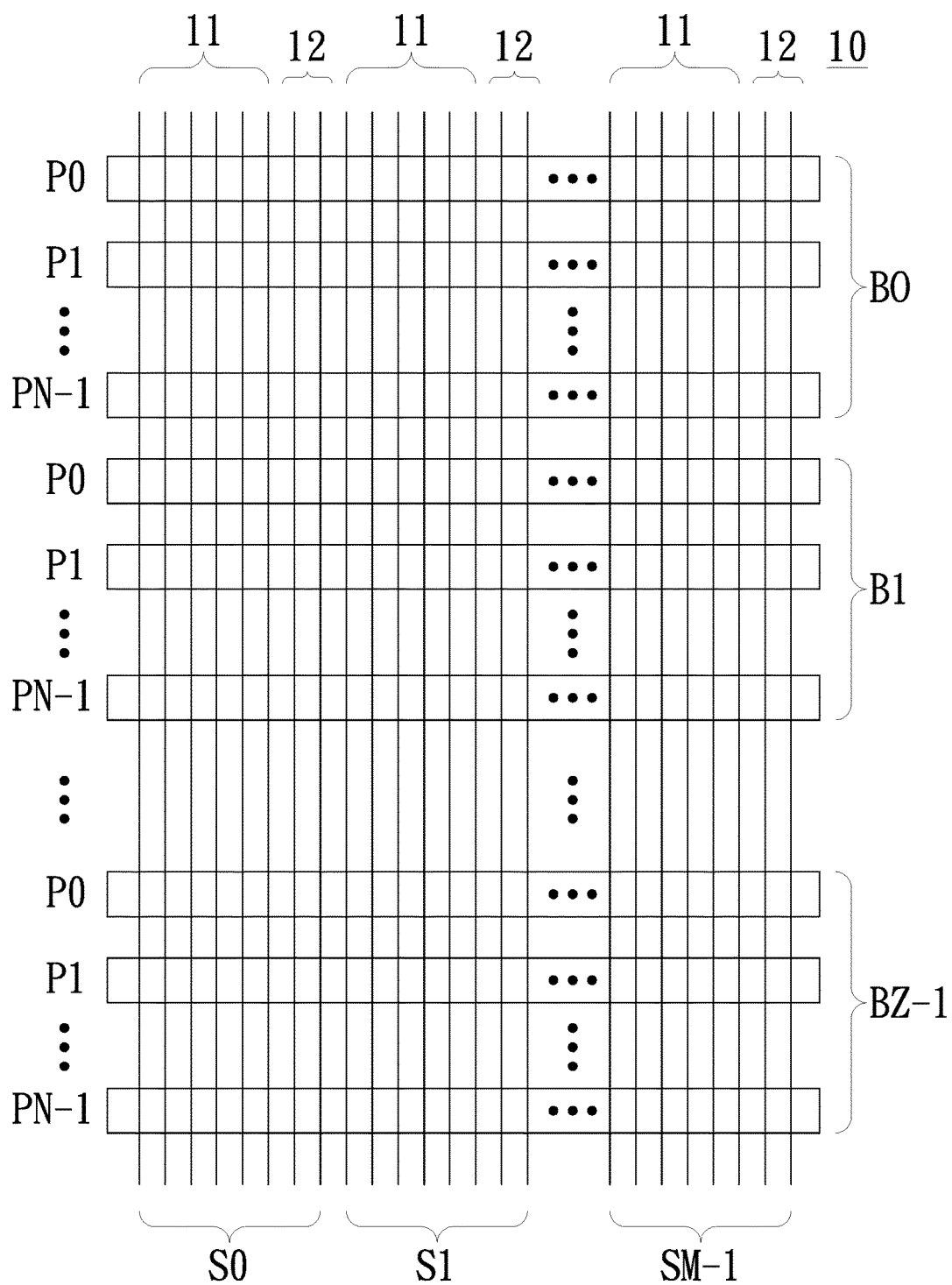
FIG. 5 is a schematic view of another data storage medium.

FIG. 5 is a schematic view of another data storage medium. Compared with FIG. 1, a difference lies in that each one of the segments S0 to SM-1 has a data area 11 and a respective spare area 12 in the data storage medium of FIG. 5. With the structure modification, the purpose of the present invention is still achieved without any change; thus, no redundant detail is to be given herein.

In summary, the method for screening bad column of the present invention first determines the segment having the largest total number of error bits in a certain number of data blocks, determines the column having the largest number of error bits in the segment having the largest total number of error bits as a bad column, and records the bad column in the bad column summary table. Therefore, the control unit of the data storage device of the present invention can be prevented from accessing these bad columns according to the bad column summary table. As a result, all the segments can be used for storing data except the bad columns, and consequentially the data storage medium of the data storage device of the present invention has the optimizing data storage capacity.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for screening bad columns applicable to a data storage medium, wherein the data storage medium comprises a plurality of data blocks, each of the data blocks comprises a plurality of data pages, each of the data pages comprises a plurality of columns in a same row, wherein the columns are divided into a data area and a spare area, the columns in the data area further are divided into a plurality of segments, and the method for screening bad column comprising steps of:

reading out written data of at least one of the data pages of at least one of the data blocks;

comparing the written data with predetermined data to obtain a number of error bits in each of the columns in each of the segments in the at least one of the data pages, and accordingly calculating a total number of error bits in each of the segments;

determining a segment having a largest total number of error bits from the segments;

determining and recording a column having a largest number of error bits from the segment having the largest total number of error bits as a bad column, wherein the segment having the largest total number of error bits has a higher priority to move the bad column therein so that the segment has the largest total number of error bits is still usable;

recording the bad column in a bad column summary table, and preventing from accessing the bad column according to the bad column summary table; and making the data area to extend one column toward the spare area, and reallocating the columns in each of the segments by shifting each segment following the segment with the bad column to the right by one column so as to make a total number of the columns in each of the segments unchanged.

2. A data storage device for storing a bad column summary table, wherein the data storage device comprises a control unit and a data storage medium, the data storage medium comprises a plurality of data blocks, each of the data blocks comprises a plurality of data pages, each of the data pages comprises a plurality of columns in a same row, wherein the columns are divided into a data area and a spare area, the columns in the data area further are divided into a plurality of segments, and the bad column summary table is generated and updated according to steps of:

reading out written data of at least one of the data pages of at least one the data blocks;

comparing the written data with predetermined data to obtain a number of error bits in each of the columns in each of the segments in the at least one of the data pages, and accordingly calculating a total number of error bits in each of the segments;

determining a segments having a largest total number of error bits from the segments;

determining and recording a columns having a largest number of error bits from the segment having the largest total number of error bits as a bad column, wherein the segment having the largest total number of error bits has a higher priority to move the bad column therein so that the segment has the largest total number of error bits is still usable;

recording the bad column in a bad column summary table, and preventing from accessing the bad column according to the bad column summary table; and making the data area to extend one column toward the spare area, and reallocating the columns in each of the segments by shifting each segment following the segment with the bad column to the right by one column so as to make a total number of the columns in each of the segments unchanged.

* * * * *